March 20, 1962 L. E. MUELLER 3,025,593

APPLICATOR FOR APPLYING ELECTRONIC COMPONENTS
TO PRINTED CIRCUIT BOARDS

Filed May 25, 1959 5 Sheets-Sheet 1

INVENTOR.
LAWRENCE E. MUELLER.
BY
Wallace P. Lamb
ATTORNEY.

INVENTOR.
LAWRENCE E. MUELLER.
BY
Wallace P. Lamb
ATTORNEY.

March 20, 1962 L. E. MUELLER 3,025,593
APPLICATOR FOR APPLYING ELECTRONIC COMPONENTS
TO PRINTED CIRCUIT BOARDS
Filed May 25, 1959 5 Sheets-Sheet 3

INVENTOR.
LAWRENCE E. MUELLER.
BY
Wallace P. Lamb
ATTORNEY.

INVENTOR.
LAWRENCE E. MUELLER.
BY
Wallace P. Lamb
ATTORNEY.

March 20, 1962 L. E. MUELLER 3,025,593

APPLICATOR FOR APPLYING ELECTRONIC COMPONENTS TO PRINTED CIRCUIT BOARDS

Filed May 25, 1959 5 Sheets-Sheet 5

INVENTOR.
LAWRENCE E. MUELLER.
BY
Wallace P. Lamb
ATTORNEY.

3,025,593

APPLICATOR FOR APPLYING ELECTRONIC COMPONENTS TO PRINTED CIRCUIT BOARDS

Lawrence E. Muller, Livonia, Mich., assignor to Burroughs Corporation, Detroit, Mich., a corporation of Michigan Filed May 25, 1959, Ser. No. 815,428
10 Claims. (Cl. 29—203)

This invention relates generally to applicators and particularly to applicators for applying electronic components to printed circuit boards.

It is an object of the invention to provide an improved applicator for applying electronic components to a printed circuit board without danger of damaging the components.

Another object of the invention is to provide an improved applicator for applying electronic components to a printed circuit board in such manner as to tentatively hold the components to the board preparatory to soldering the wire conductors of the component to terminals of the circuit.

Another object of the invention is to provide an improved applicator for applying electronic components to a printed circuit board in such a manner as to make it possible to employ the wire conductors of the components as a holding means for holding the components to the board temporarily, or until the conductors can be secured such as by a dip soldering operation.

Another object of the invention is to provide an improved applicator for applying electronic components to a circuit board by inserting the wire conductors into apertures in the board by an inserting force that is directly applied to the conductors in such manner as to insure alignment and direction of the conductors into their respective apertures.

Another object of the invention is to provide an improved applicator of the above mentioned character that will apply electronic components to a printed circuit board such that the body of the components are spaced above the board to permit visual inspection under the components for solder meniscuses that may have run together and established short circuit connections.

Another object of the invention is to provide for applicators of the above mentioned character, an improved head structure for applying electronic components to printed circuit boards.

A further object of the invention resides in the provision of an applicator control system to control the insertion operation.

Other objects of the invention will become apparent from the following description taken in connection with the accompanying drawings in which, FIG. 1 is a side elevational view partly broken away and in section of my improved applicator;

Figure 1:
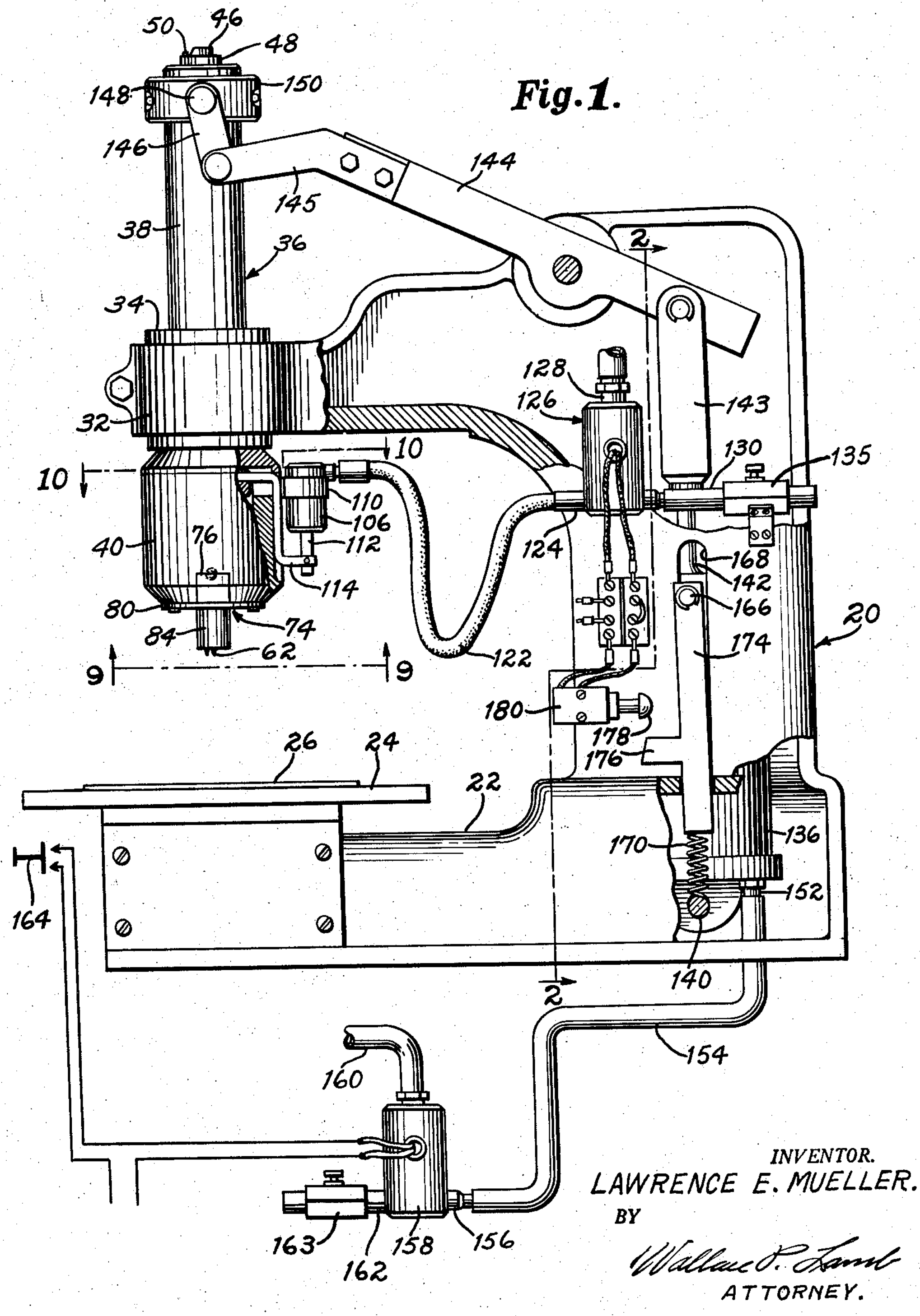

Referring to the drawings by characters of reference, the applicator shown includes a suitable supporting means or standard 20 having a base 22 provided with a horizontal bed plate 24 to support a circuit board 26 during the operation of applying an electronic component 30 to the board. Above the bed plate 24, the standard 20, which may be of the conventional C-shape type, has a split boss 32 containing an axially vertically disposed bushing 34 that slidably receives and guides an applicator head 36 for movement toward the bed plate 24 in the operation of applying an electronic component to the board 26.

The applicator head 36 has a body and parts driver component which is preferably tubular in shape and made in two sections including an upper tubular section 38 and a lower tubular section 40. The tubular sections 38 and 40 are secured together in vertical axial alignment by means of screws 42. A key 44 on the upper section 38 of the head 36 engages in a keyway provided in the bushing 34 to prevent the head from turning.

Positioned within and extending vertically and entirely through the tubular head 36 there is a magazine 46 in the form of an open ended tube to hold a supply of the electronic components 30. The components 30 are contained in a single stack in the magazine 46 and feed downwardly by gravity to the discharge end of the magazine upon removal from the magazine of the lowermost one of the components. As shown, the magazine 46 projects below the lower end of the head 36. A collar 48 secured to the upper end of the magazine 46 seats on the upper end of the head 30 to determine the proper vertical position of the magazine relative to the head 36, and preferably the collar 48 carries a pin 50 engageable in a locating hole in the head 30 to hold the magazine from turning. Fixed in and to the lower end of the magazine 46 is a yieldable holder 52 in the form of a tubular insert which functions normally to prevent the stack of electronic components 30 from moving down and out of the magazine. At its lower end, the holder 52 is slotted to provide a plurality of radially spaced spring fingers 54 which are bent inwardly slightly to engage and frictionally hold the lowermost one of the electronic components 30 in and to the magazine 46.

Figure 8:
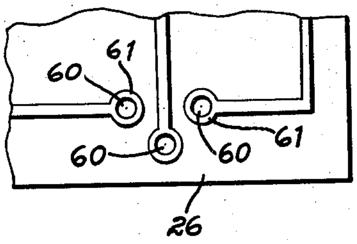
FIG. 8 is an enlarged fragmentary plan view of the circuit board.
Figure 7:
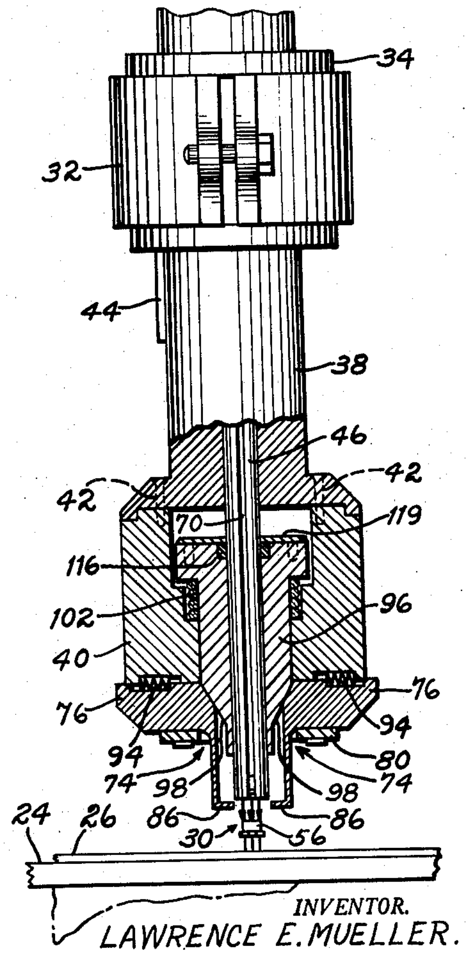
FIG. 7 is a view similar to FIG. 6 showing the applicator head in the act of returning to its retracted or "up" position.
Figure 9:
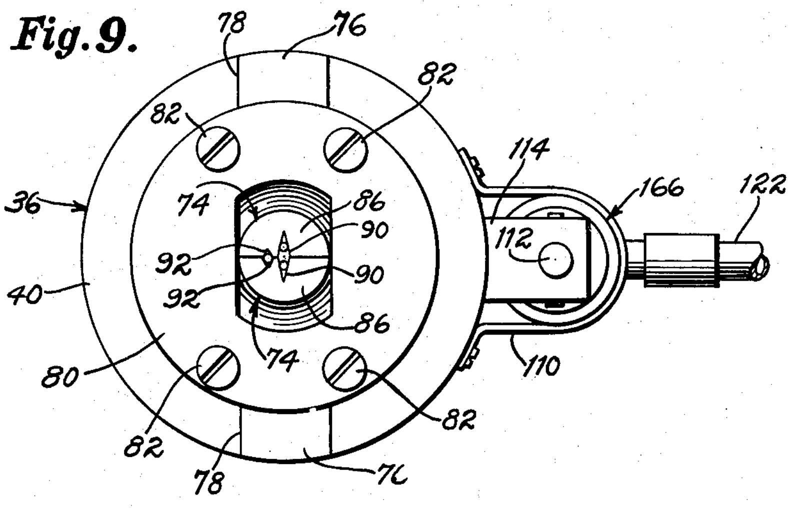
FIG. 9 is a bottom view of the applicator head, taken in the direction of the arrows 9—9 of FIG. 1.

The electronic components 30 are encased and sealed in individual cylindrical casings 56 and projecting from the end of each is a number of wire conductors 58 of which there are three in the present instance. In applying an electronic component 30 by my applicator to the circuit board 26, the three wire conductors 58 of the component are inserted respectively into three apertures 60 in the board 26 (see FIG. 8).

On opposite faces of the board 26 is a printed circuit having the usual conductor leads provided with terminals 61 at the apertures 60. In the process of applying the circuit to the board 26 the walls of the apertures 60 are plated, as at 63, so as to electrically connect the terminals 61 of opposite faces of the board together.

Each of the wire conductors 58 is provided with a wedge-shaped tip member 62 and these tip members are adapted to wedge into the plated apertures 60 for tentatively holding the components 30 to the board during handling and during a subsequent dip soldering operation. The tip members 62 are applied to the wire conductors 58 by a machine (not shown) which wraps and crimps a strip of metal about the end portion of each conductor 58 in such manner as to form the tip in a wedge shape and preferably also to form a recess 64 in the tip member for receiving solder to provide a good electrical connection between the wire conductors 58, the tip member 62 and the terminals 61 of the printed circuit. In addition, the tip member 62 provides an upwardly facing shoulder 66 for a purpose hereinafter described. As shown, the electronic components 30 are stacked in the magazine 46 with the wire conductors 58 directed downwardly and seating at their ends on the top of the preceding components. The lowermost one of the components 30 is yieldably held in the holder 52 in a vertical position such that the conductor tip members 62 of the component project out of the lower end of the magazine 46 and such that the tip member shoulders 66 are below the lower end of magazine 46. Each of the components 30 is provided on its casing with a lateral projection or key 68 to engage in a locating slot 70 that is provided in and extends the entire length of the tubular magazine 46, the locating slot 70 registering with a similar slot 71 in the yieldable holder 52.

Carried by the head 36 on the lower end thereof is a pair of oppositely disposed holders or back-up plates or jaw members, designated generally by the numeral 74 which function to hold the lowermost one of the electronic components 30 to the head during downward movement of the head and insertion of the tipped conductors into the apertures 60 in board 26 and thus the back-up plates cooperate with the body as a component of the parts driver. The jaw members 74 have horizontally disposed mounting or carrier portions 76 that are slidably guided in aligned slots 78 in the lower end of head 36 and on a retainer plate 80 that is secured by screws 82 to the lower end of the body to provide a transverse slideway for portions 76. Integral with the mounting portions 76 are downwardly directed extensions 84 which are inturned just below the lower end of magazine 46 providing horizontal jaw portions 86. The jaw portions 86 position slightly above the shoulders 66 formed by the tip members 62 and on downward movement of head 36 abut said shoulders to hold the electronic component to the head. The jaw portions 86 have opposed edge faces in each of which there is provided a V-way or notch 90, the notches being in alignment with each other such that when the jaw members 74 are closed an occluded area is provided, bounded by the faces form of V-shaped notches. Two of the conductors 58 are received in the rhomboid-shaped opening. The remaining one of the three conductors 58 is retained by a pair of similar, but smaller notches 92 in the opposed edges of the jaw portions 86 which also form a rhomboidal configuration bounded by the edges of the V-shaped notches. These V-shaped notches 90 and 92 are so located that when the jaw members 74 are closed, the conductors 58 are held in the apices of the V-shaped notches 90, 92 in accurate alignment with the apertures in the printed circuit board 26. If the conductors 58 are bent outwardly as they tend to be, and which is apparently caused by the application of the tip members 62 to the conductors, it will be seen that the conductors will be straightened as they lodge in apices of the notches 90, 92 on closing of the jaws. A pair of helical coil spring 94 are used to urge the jaw members 74 closed.

Figure 6:
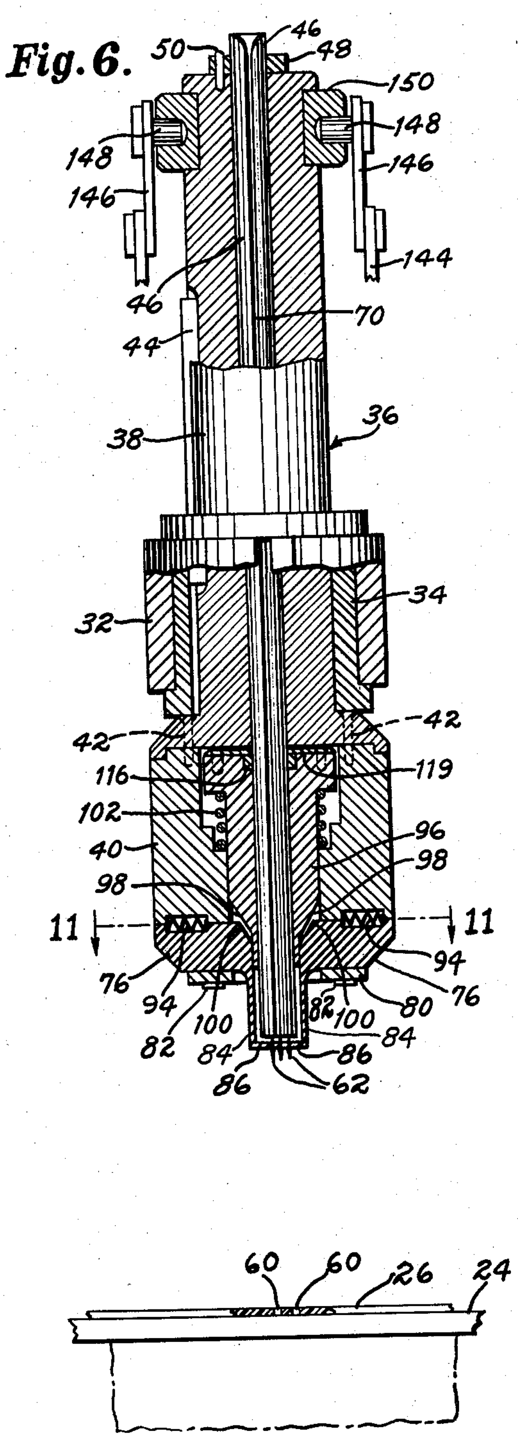
FIG. 6 is an enlarged front view broken away and in section of the applicator head.
Figures 10, 11, 12:
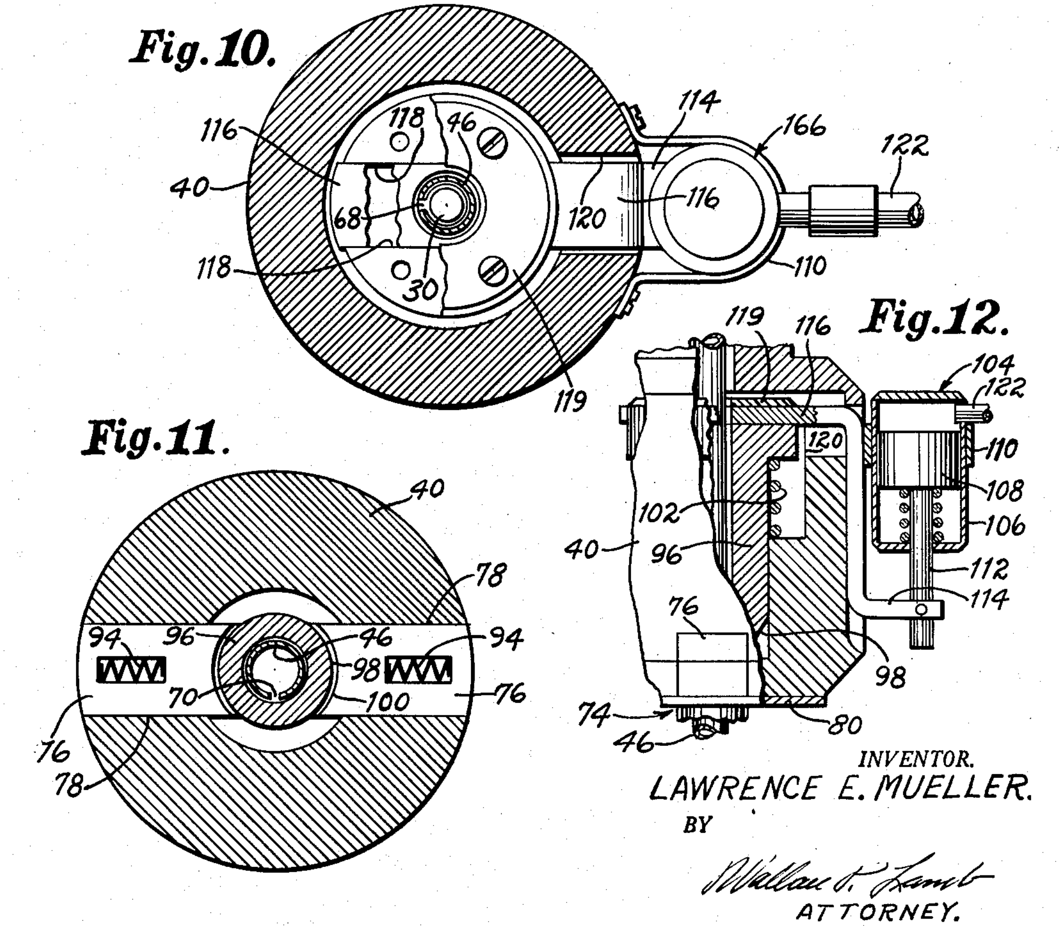
FIG. 10 is a cross sectional view of the head, taken along line 10—10 of FIG. 1.
FIG. 11 is another cross sectional view of the head, taken along line 11—11 of FIG. 6.
FIG. 12 is an enlarged fragmentary view of the applicator head shown partly broken away and in section.
Figures 13, 15, 16:
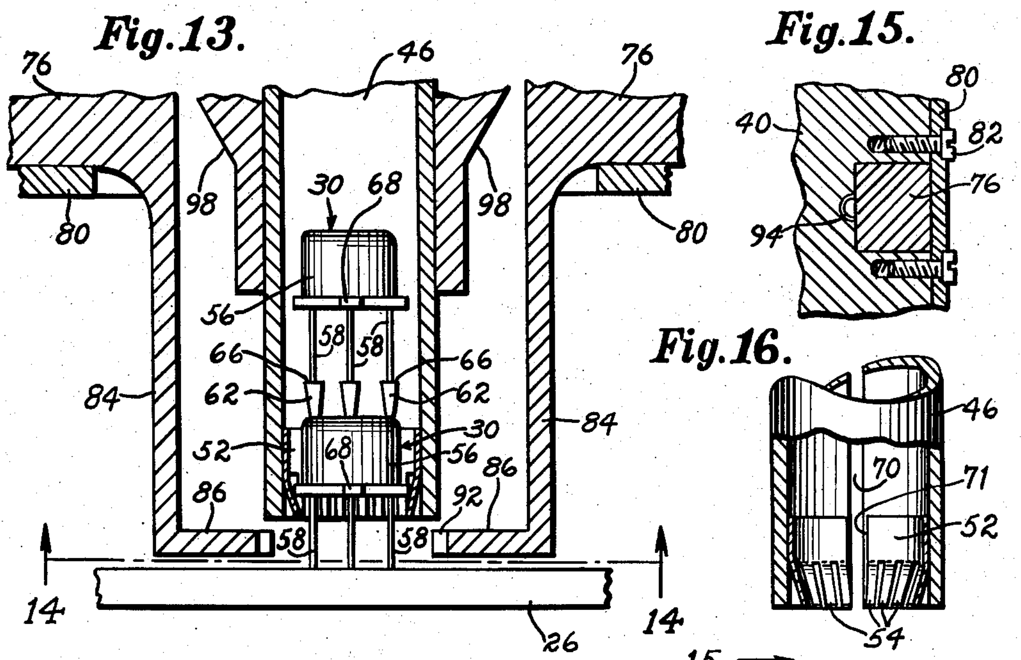
FIG. 13 is an enlarged fragmentary vertical sectional view of the applicator head.
FIG. 15 is a sectional detail view, taken along line 15—15 of FIG. 14.
FIG. 16 is an enlarged fragmentary detail view, partly broken away and in section.
Figures 14, 17:
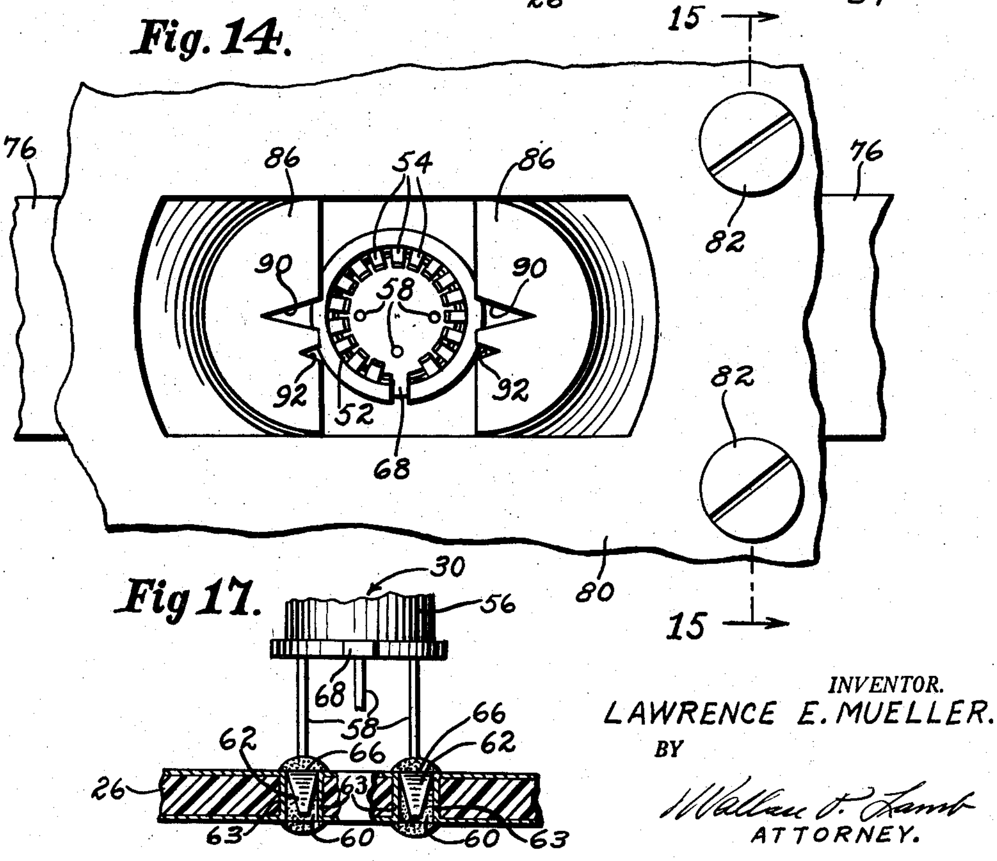
FIG. 14 is an enlarged fragmentary bottom view of the applicator head, taken in the direction of the arrows 14—14 of FIG. 13.
FIG. 17 is an enlarged view partly in elevation and partly in section of an assembled printed circuit board and electronic component.

Within the lower section 40 of the head 36 there is a vertically movable cam member 96 having cam surfaces 98 to engage corresponding cam surfaces 100 on the jaw members 74 to open or spread the jaw members apart. The cam member 96 is preferably tubular in form and surrounds the tubular magazine 46, the cam member being guided in a bore in the head section 40 and having a loose fit with the magazine 46. A helical coil spring 102 acts to urge the cam member 96 upwardly to its retracted position shown in FIG. 6, in which position the springs 94 hold the jaw members 74 closed. A power element 104, such as an air cylinder and piston 108, is provided to actuate the cam member 96 and is mounted on and externally of the head 36, such as by means of a bracket 110. The piston 108 has the usual connecting rod 112 extending from cylinder 106 and the rod and cam member are connected together by a connecting member 114. In the present construction, the connecting member 114 has a horizontal leg 116 that is secured by screws to the cam member 96 in a clearance slot 118 that is provided in the top of the cam member and covered by a retainer plate 119. As shown in FIG. 10, the connecting member 114 projects through a clearance slot 120 provided in the side wall of the head section 40 and has a vertical leg that is connected to the piston rod 112.

Figure 4:
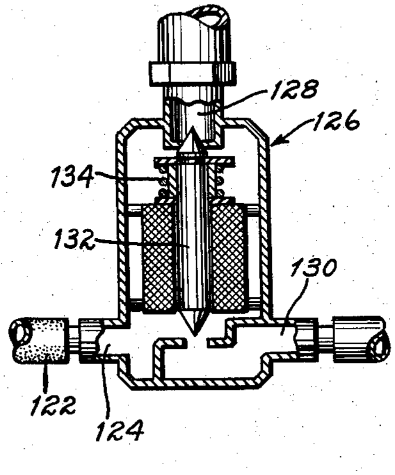
FIG. 4 is a vertical sectional view of one of two like valves employed in the control system of the applicator.
Figure 3:
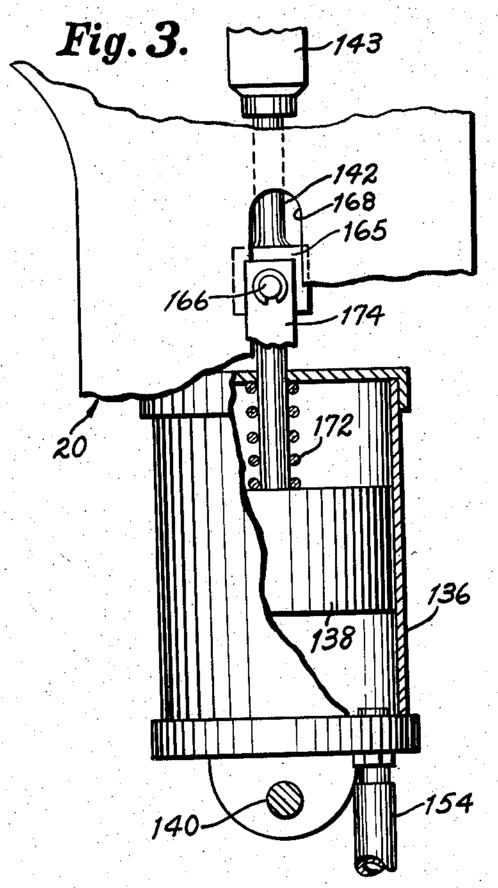
FIG. 3 is an enlarged fragmentary view partly broken away and in section of certain details of the applicator operating mechanism.

The air cylinder 104 is connected by a flexible conduit or hose 122 to an air outlet 124 of a solenoid valve 126 which has an air inlet 128 for connection to a source of compressed air. The solenoid valve 126 is of the two-way type illustrated in FIG. 4 and has an outlet 130 to atmosphere. A valve member 132 controls both the air inlet 128 and the outlet 130 and is biased by a spring 134 normally to close the inlet 128, as shown. It will be apparent that when the solenoid 126 is energized, the valve member 132 will open the inlet 128 and close the outlet 113 whereby the piston 108 will move the cam member 96 downwardly and open or retract the jaw members 74. When solenoid 126 is de-energized, the valve member 132 closes the inlet 128 and opens the outlet 130 to allow the air in the cylinder of power element 104 to escape to atmosphere so that the springs 94 can move the jaws 86 inwardly to closed positions. However, this action is delayed by the provision of an air flow restricting valve 135 that is connected to outlet 130 and is preferably adjustable to regulate the rate of escape of air to atmosphere. Any conventional air flow restricting valve may be used. The purpose of the restricting valve 135 is to delay the closing of the jaws 86 until the head had moved upwardly sufficiently to clear the electronic component casing.

Figure 2:
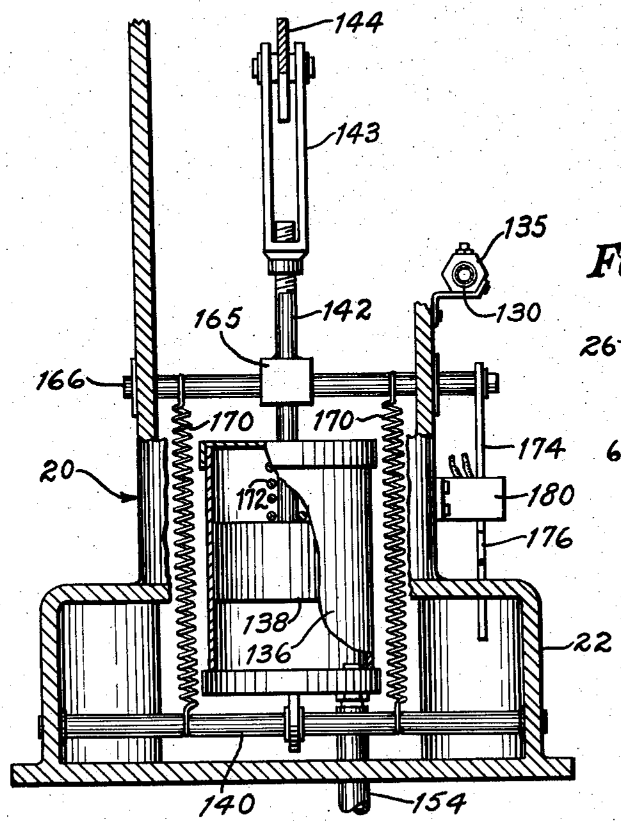
FIG. 2 is a vertical sectional view taken along the line 2—2 of FIG. 1.
Figure 5:
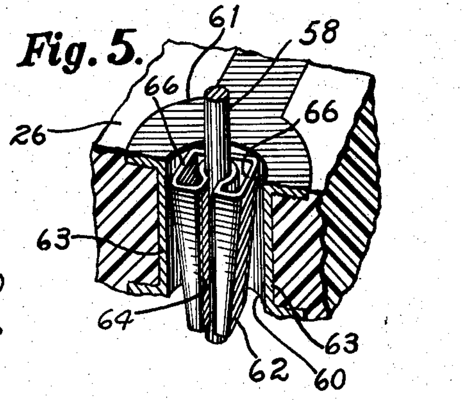
FIG. 5 is a fragmentary perspective view showing one of the wire conductors of an electronic component inserted in a printed circuit board.

To operate the applicator head 36, i.e., move it down to apply an electronic component 30 to the circuit board 26, any suitable power means may be employed, such as the air cylinder 136 and piston 138. In the present construction, the air cylinder 136 is pivoted at its lower end on a shaft 140 that is fixed at opposite ends thereof in and to the sides of the standard 20 (see FIG. 2). The piston 138 has an upwardly extending rod 142 connected by a clevis 143 to one arm of a lever 144 which is pivoted on the standard 20. The other end of the lever 144 is forked to straddle the head 36 and the forked ends, as at 145 are connected pivotally by pins 148 to a split collar 150 on the upper end of head 36.

The air cylinder 136 has a single port 152 for the entrance and exit of compressed air and this port 152 is connected by a conduit 154 to the air outlet 156 of a solenoid valve 158. The valve 158 is similar to the two-way valve 126 of FIG. 4 having an air inlet 160 for connection to the source of compressed air and an outlet 162 to atmosphere. Connected to the outlet 162 is an air flow restricting valve 163 which may be like the above mentioned valve 135. The valve 163 is set to restrict the escape of air to atmosphere so as to effect a slight delay in the upward movement of the head 36. A manually operable switch 164 is provided to control energization of the solenoid 158 and may be a push button switch, as shown.

On the piston rod 142 above the air cylinder 136 there is an integral boss 165 in which a transverse rod 166 is secured, the rod extending through vertical clearance slots 168 in the sides of the standard 20. Connected to the rod 166 are the upper ends of a pair of helical coil springs 170 which are anchored at their lower ends to the shaft 140. These springs 170 aided by a spring 172 in air cylinder 136 act to return the head 36 to its upper or retracted position. It will be understood that the closing of the push button switch 164 instantly provides sufficient air pressure against piston 138 to move the head 36 down to the board 26 and that the bleed 162 allows the air to escape slowly from cylinder 136, the purpose being to effect a delay in the retraction of the head for a period sufficient to insure that the jaw members 74 have opened so as to avoid pulling the applied electronic component out of the board.

Carried by the rod 166 on one end thereof is a cam member 174 having a cam surface 176 to engage an operator 178 of a limit switch 180 that controls the solenoid 126. The cam surface 176 and the switch operator 178 are arranged such that the switch 180 is closed at about the same time that the jaws 74 engage the board 26.

Any suitable registering device may be used to align the board 26 with the apertures 60 therein in registration with the positions that the conductors 58 will assume when held by the jaws 74, such as for example, a pantograph machine (not shown).

In operation, assuming that the magazine 46 is loaded with a supply of the electronic components 30 and that the printed circuit board 26 is properly positioned with respect to head 36, the applicating operation is initiated by the pressing of the push button switch 164. The closing of switch 164 energizes the solenoid valve 158 to allow compressed air to pass therethrough and act on and move piston 138 upwardly. Upward movement of piston 138 pivots the lever 144 in a direction to move the head 36 downward toward the board 26 until the jaws 74 rest lightly on the upper surface of the board and upper faces of the flush terminals 61 of the printed circuit. As the head 36 approaches the board 26, the wedge-shaped tip members 62 are inserted in their respective apertures 60 of the board and continued downward movement of the head wedges the tip members into the apertures whereby to hold the component 30 to the board. At about the same time that the head 36 reaches its "down" position, the cam 176 acting against operator arm 178 closes switch 180 which energizes the two-way solenoid valve 126. Energization of the solenoid valve 126 established communication between the source of compressed air and the cylinder 106 wherein the piston 108 is driven down by the air pressure to operate cam member 96 which is forced downward to open the jaws 74. As previously mentioned, the air bleed 162 of the solenoid valve 158 restricts escape of the trapped air in cylinder 136 and as a consequence delays retraction of the head 36 by springs 170, 172 for an interval to insure that the jaw members 74 have opened so that the component will not be pulled out of the board as the head moves upwardly toward its retracted position. Also, the closing of the jaws 74 is delayed momentarilly to insure that the electronic components in the magazine 46 have had time to move down such that the lowermost one of the components 30 is in the yieldable holder 52. As the head 36 moves upwardly, the spring fingers 54 of holder 52 yield outwardly to release the applied component and then return to intercept the next component in the magazine 46. The timing of the head and jaw operations may be such that the jaws 74 are allowed to close at any time after the head 36 has moved upward to a point where the jaws clear the body of the component previously applied to board 26. As the jaws close, they position just above the shoulders 66 formed by the tip members 62 of the component in holder 52, the V-notches 90, 92 of the jaws receiving the conductors 58 and directing them toward the apertures in board 26.

From the foregoing description, it will now be appreciated that I have provided an improved applicator for applying electronic components to a printed circuit board by the insertion of the conductors of the component into apertures in the board. Further, it will be appreciated that by my improved applicator, accurate insertion of the conductors into the apertures in the board is achieved by the provision of holders or jaws that act directly on the conductor tip members to guide them into the apertures. Also, I have provided an improved applicator head of a character such that it contains a magazine for the electronic components arranged so that the components feed down in position to allow the holders or jaws to engage back of the conductor tip members. In addition, I have provided a control system for controlling operation of the applicator head and jaws to provide a timed relationship between retraction of the head and the opening and closing of the jaws to insure against pulling an applied electronic component out of the board upon retraction of the head.

While I have shown and described the invention in considerable detail it will be understood that many variations of the applicator may be made without departing from the spirit and scope of the invention.

What I claim is:

1. In an applicator for inserting respectively into apertures in a mounting member the enlarged end portions of wire conductors of an electrical component, supporting means for the mounting member, a body mounted on said supporting means for movement from an upper retracted position downwardly toward the mounting member during the insertion operation, means operable to move said body, said body having a vertical passage therethrough for containing a supply of the components and said components arranged with their conductors extending downwardly, said passage having a lower outlet down to which the components move successively as the lowermost one of the components is applied to the mounting member, yieldable means at said outlet engaging the lowermost one of the components and opposing downward movement of the components, said yieldable means holding the lowermost one of the components with the enlarged conductor end portions thereof projecting externally of said passage through said outlet, a pair of oppositely disposed separable back-up members mounted on said body at said outlet and biased to closed position, said back-up members having opposed faces with cooperating V-shaped recesses therein to receive said conductors back of the enlarged portions to hold the conductors to said body during the insertion operation and align the conductors with the apertures, a power element mounted on said head and operatively connected to and for retracting said holder members, a control member operatively connected to and for activating said power element, and cam means movable with said body and actuating said control member to retract said back-up members prior to upward movement of said body.

2. An applicator tool for inserting an electronic component having a cylindrical body with three axially directed conductors extending from one end of the body in a triangular array into a mount receiving the conductors in a corresponding array of apertures therein, each of said conductors having a tiplet secured to the end thereof forming an enlargement of the conductor spaced from the aforesaid end of the component body, said tool comprising a pair of retractable jaws having occluding surfaces for grasping the conductor portions of said component between the tiplet and the component body, each of said jaws having a first V-way opening in the occluding surface thereof and aligned with an oppositely extending V-way in the opposite jaw to form a diamond shaped opening in the occluded position of the jaws each wholly receiving a different one of two of the component conductors forming the base of the triangular array in its respective V-way, each of said jaws having a second similarly directed but smaller V-way therein forming with the other jaw a similarly directed but smaller diamond shaped opening in the occluded position of the jaws and receiving the remaining one of the component conductors at the apex of the triangular array in both of said smaller V-ways in the occluded positions of the jaws.

3. A parts applicator comprising a body having a vertical passage therethrough, a tubular magazine extending through said passage and having a discharge end projecting below the lower end of said body, a spring parts holder at the discharge end of said magazine releasably engaging and holding the lowermost part below and in spaced relation to the discharge end of said magazine, a pair of oppositely disposed carrier plates slideably mounted on the lower end of said body for movement toward and away from each other, spring means interposed between the opposed faces of said body and said carrier plates biasing said plates toward each other, a pair of oppositely disposed back-up plates respectively carried by said pair of carrier plates at the discharge end of said magazine and positionable back of the part by said spring means, and a power element mounted on said body operatively connected to move said back-up plates away from each other to clear the discharge for passage of the next part to said spring holder.

4. A parts applicator comprising an elongated body having a longitudinal bore therethrough communicating with a chamber at one end of the body, an open ended parts guiding magazine extending through said bore and chamber and having a discharge end projecting externally of said body at the said one end thereof, spring means within said magazine at the discharge end thereof yieldably holding the parts against discharge from said magazine, a movable cam member within said chamber slideably guided longitudinally by and along said magazine, said cam member biased in one direction, means mounted on the said one end of said body and cooperable therewith to form a slideway transversely of said bore, a pair of retractable abutment members guided in said slideway and movable toward each other to hold the part at the discharge end of said magazine to said body and movable away from each other to release the part, spring means biasing said abutment members toward each other, cam means on said abutment members cooperable with and upon movement of said cam member in the other direction to move said abutment members away from each other, and a power element mounted on said body and operable to move said cam member in said other direction.

5. In an applicator having a support for a mounting member into which a part is to be inserted, a head carrying a supply of the parts and movable toward the support comprising, a body having a chamber at one end thereof and a bore intersecting the chamber, a magazine tube for parts, said magazine tube extending through said bore and chamber and having a discharge end projecting from said body at said one end, spring means at the discharge end of said magazine yieldably restraining movement of the parts out of the discharge end of said magazine, a cam member slideably guided on said magazine within said chamber and biased in one direction longitudinally of said magazine, a plate affixed to the said one end of said body in broadside spaced relation thereto providing a slideway transverse to said magazine, a pair of carrier plates slideably received in said slideway for movement toward and away from each other, spring means interposed between the opposed faces of the said one end of said body and said carrier plates urging the plates toward each other, cam means on said pair of carrier plates cooperable with said cam member to move said pair of carrier plates away from each other on movement of said cam member in the other direction, a pair of laterally positioned back-up plates carried respectively by said pair of carrier plates and movable over the discharge end of said magazine to engage back of the part when said carrier members are moved toward each other, and a power element carried by said body operatively connected to move said cam member in said other direction.

6. In a parts applicator, a support for a mounting member having an aperture, a hollow body above said support for containing a stack of parts and having a lower parts discharge end, said body mounted for vertical movement from an upper retracted position to a lower position at the mounting member to insert a part into the aperture, resilient means on said body releasably holding the lowermost one of the parts to said body externally of and spaced from the discharge end thereof, means cooperable with the discharge end of said body forming slideways transverse to said passage, a pair of oppositely disposed back-up plates in said slideways movable toward each other back of the lowermost part, spring means interposed between said body and said back-up plates biasing said plates toward each other, a movable cam member within said body cooperable on movement in one direction with cam means on said back-up plates to move said plates away from each other, an electrically operated power element operable when energized to move said cam member in said one direction and hold said back-up plates separated for an interval to allow the next part to pass downwardly between said plates to the resilient means, a switch controlling said power means, and a switch actuator movable with said body and actuating said switch on movement of said body to the said lower position thereof.

7. An applicator for shouldered parts comprising a vertically movable body and parts driver having a vertical passageway therethrough for the parts and a lower discharge end, a yieldable holder holding the parts against moving down and releasably holding the lowermost part with the shoulder of the part spaced below the discharge end, a pair of oppositely disposed carrier members mounted on said body above the discharge end for movement toward and away from each other transversely of the passageway, a pair of oppositely disposed back-up plates respectively carried by said carrier members in a horizontal plane overlying the discharge end and in position to back up the shoulder, spring means interposed between said body and said carrier members and normally holding said back-up plates in the back-up position, and a power element operatively connected to move said carrier members away from each other to effect clearance of the discharge end by said back-up plates.

8. A parts applicator comprising a body movable vertically toward and away from a support for a board having an aperture to receive a part, said body having a vertical passageway therethrough, a tubular magazine in said passageway for storing a number of vertically stacked parts therein and having a lower discharge end projecting below said body, means within the discharge end of said magazine releasably to hold the lowermost one of the parts to said magazine against the weight of the stack of parts and to hold the lowermost part in spaced relation to and below the discharge end of said magazine, a pair of oppositely disposed carrier plates mounted on said body above the discharge end of said magazine for movement transversely to the passageway, a pair of oppositely disposed back-up plates respectively carried by said carrier plates in a horizontal plane adjacent the discharge end to back up the part to effect insertion of the part in the board by downward movement of said body, said back-up plates movable with said carrier plates toward and away from each other between inner positions backing up the part to outer positions clearing the discharge end of said magazine, spring means interposed between said body and said carrier plates holding the back-up plates in their back-up positions, and a power element operatively connected to said carrier plates and operable to move them away from each other to effect clearance of the discharge end of said magazine by said back-up plates.

9. A parts applicator comprising a body and parts driver mounted for vertical movement from an upper retracted position downwardly to drive a part into a mounting member, an open ended parts magazine carried by and extending vertically through said body, said magazine having a lower discharge end frictionally and releasably holding a stack of parts in said magazine against moving down and holding the lowermost part below and in spaced relation to the discharge end of said magazine, a pair of oppositely disposed carrier members mounted on said body at the lower end thereof and movable toward and away from each other transversely of said magazine, a pair of opposed cam members respectively on said carrier members, said magazine extending between said cam members with the discharge end of said magazine below said carrier members, a pair of oppositely disposed back-up plates respectively carried by said carrier plates in downward offset relation thereto to engage over the discharge end of said magazine back to the lowermost part when said carrier members are moved toward each other, the lower end of said body and the adjacent faces of said carrier members having cooperating recesses forming a pair of oppositely disposed pockets respectively on opposite sides of said magazine, spring means contained within said pockets and urging said carrier members toward each other, a vertically movable cam member surrounding said magazine within said body and cooperable with said pair of cam members to move said carrier members away from each other to effect clearance of the discharge end of said magazine by said back-up plates, and a power element operatively connected to actuate said vertically movable cam member.

10. A parts applicator comprising a vertically movable driver component having a vertical passage therethrough for a stack of parts and having a lower discharge end, a releasable holder mounted on said driver at the discharge end thereof, said holder supporting the stack of parts and releasably holding the lowermost one of the parts in spaced relation to and below the discharge end, a pair of oppositely disposed carrier members mounted on said driver component above the discharge end for movement toward and away from each other transversely of the passage, spring means interposed between said driver and said carrier members biasing said carrier members toward each other, a pair of back-up plates respectively carried by said carrier members and transversely movable back of the part below the discharge end, said back-up members constituting retractable components of said driver, and a power element operatively connected to said carrier members to retract said back-up plates against the action of said spring means.

References Cited in the file of this patent

UNITED STATES PATENTS

| | | |
|---|---|---|
| 2,666,255 | McCoy | Jan. 19, 1954 |
| 2,820,283 | Anderson | Jan. 21, 1958 |
| 2,878,556 | Heidergott | Mar. 24, 1959 |
| 2,896,208 | Alderman | July 28, 1959 |